United States Patent
Lavery et al.

(10) Patent No.: US 9,288,898 B2
(45) Date of Patent: Mar. 15, 2016

(54) RECONFIGURABLE STRETCHABLE CONNECTOR SUBSTRATE

(71) Applicant: PALO ALTO RESEARCH CENTER INCORPORATED, Palo Alto, CA (US)

(72) Inventors: Leah Lavery, San Jose, CA (US); Tse Nga Ng, Palo Alto, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 336 days.

(21) Appl. No.: 13/622,305

(22) Filed: Sep. 18, 2012

(65) Prior Publication Data

US 2014/0078690 A1  Mar. 20, 2014

(51) Int. Cl.
*H05K 1/02* (2006.01)
*H05K 1/14* (2006.01)

(52) U.S. Cl.
CPC ............ *H05K 1/0283* (2013.01); *H05K 1/0289* (2013.01); *H05K 1/147* (2013.01); *H05K 2203/173* (2013.01); *Y10T 29/4913* (2015.01)

(58) Field of Classification Search
CPC ... H05K 1/0287; H05K 1/0283; H05K 1/147; H05K 1/141
USPC .......................................... 361/749; 174/254
See application file for complete search history.

(56) References Cited

U.S. PATENT DOCUMENTS

| | | | | |
|---|---|---|---|---|
| 5,112,230 A * | 5/1992 | DeSimone | | 439/55 |
| 5,537,295 A | 7/1996 | Van Den Bout et al. | | |
| 6,479,395 B1 * | 11/2002 | Smith et al. | | 438/723 |
| 7,645,943 B2 * | 1/2010 | Horiuchi | | 174/261 |
| 7,919,717 B2 | 4/2011 | Braman et al. | | |
| 8,187,795 B2 * | 5/2012 | Jain et al. | | 430/311 |
| 8,332,053 B1 * | 12/2012 | Patterson et al. | | 607/152 |
| 8,389,862 B2 * | 3/2013 | Arora et al. | | 174/254 |
| 8,629,353 B2 * | 1/2014 | Dinyari et al. | | 174/254 |
| 9,012,784 B2 * | 4/2015 | Arora et al. | | 174/254 |
| 2008/0302559 A1 | 12/2008 | Leedy | | |
| 2010/0002402 A1 * | 1/2010 | Rogers et al. | | 361/749 |
| 2010/0163283 A1 * | 7/2010 | Hamedi et al. | | 174/254 |
| 2010/0330338 A1 | 12/2010 | Boyce et al. | | |
| 2011/0185322 A1 | 7/2011 | Young et al. | | |
| 2012/0051005 A1 * | 3/2012 | Vanfleteren et al. | | 361/749 |
| 2013/0041235 A1 * | 2/2013 | Rogers et al. | | 600/306 |
| 2014/0054067 A1 * | 2/2014 | Heikenfeld et al. | | 174/250 |
| 2014/0140020 A1 * | 5/2014 | Rogers et al. | | 361/749 |
| 2015/0237711 A1 * | 8/2015 | Rogers | | H05K 1/028 174/251 |

OTHER PUBLICATIONS

Dinyari, R., Rim, S., Huang, K., Catrysse, P., and Peumans, P., Curving Monolithic Silicon for Nonplanar Focal Plane Array Applications, Applied Physics Letters, Mar. 2008, 3 Pages, vol. 92, Issue 9.

* cited by examiner

*Primary Examiner* — Jeremy C Norris
*Assistant Examiner* — Nathan Milakovich
(74) *Attorney, Agent, or Firm* — Marger Johnson

(57) ABSTRACT

Systems and methods are disclosed that include electrically connecting multiple electrical components via an electrical connection that extends through a common conductor substrate. The electrical components are bonded or otherwise secured to the common conductor substrate and the electrical connection extends between the multiple electrical components. The multiple electrical components may be components fabricated by different methods, such as photolithography and printed circuitry, and may be of different heights. The common conductor substrate is stretchable and may be a mesh configuration is some examples.

7 Claims, 4 Drawing Sheets

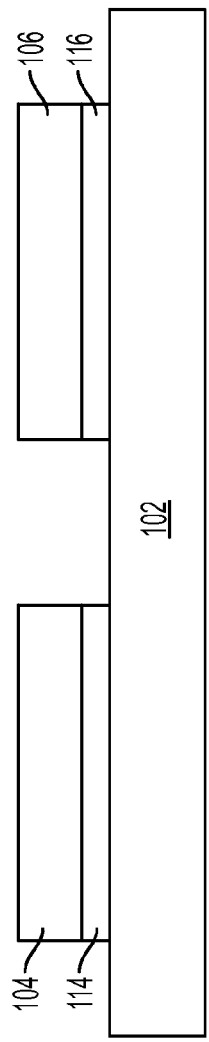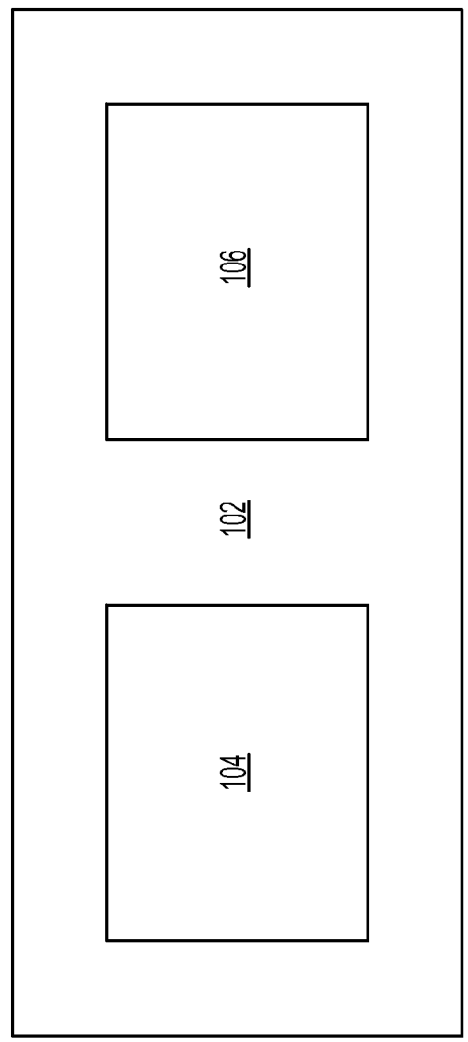

RECONFIGURABLE STRETCHABLE CONNECTOR SUBSTRATE

BACKGROUND

Connecting discrete electrical components has become commonplace in modern electronics fabrication. Many known methods for making such electrical connections directly piece together the discrete components. Some electrical connections between components, such as those on a printed circuit board (PCB), have fixed locations on a rigid substrate for making the electrical connections and require specialized tools ("pick-and-place" tools) and high levels of precision to accurately make the proper electrical connections. Other electrical components have developed in which specialized circuit designs allow reconfiguration of electrical components and the electrical connections therebetween on a substrate, such as field-programmable gate arrays (FPGAs). Still further electrical connections need to be made between electrical components of different natures, specifically between electrical components fabricated on a rigid substrate and those fabricated on a flexible substrate, such as electrical components fabricated by conventional methods like photolithography and those fabricated by direct printing methods.

Making electrical connections between various electrical components can be difficult, especially when some electrical components, such as printed circuitry, often experience low levels of reliability. Some of the low-reliability electrical components require significant amounts of time and resources to find reliable electrical components between which to place the electrical connections and can be difficult to reconfigure. Further, some systems benefit from the inclusion of multiple types of electrical components. For example, some systems benefit from integrating both electrical components printed on a flexible substrate with electrical components fabricated by a more conventional method like photolithography. Such systems are difficult to create because of the difference in heights of the electrical components, the difference in reliability of the electrical components, and the overall challenge in directly connecting different types of electrical components.

Accordingly, there remains a need for improved systems and methods for integrating printed electronic components and other high-performance devices in a single system.

SUMMARY

This disclosure relates to integrating printed circuitry and other high-performance electrical components in a single system and to creating a method of electrically connecting electrical components of different heights in a single system. More specifically, the disclosure relates to connecting various electrical components through a common conductor substrate. The common conductor substrate is a stretchable and can be a mesh configuration in some examples.

In some examples, a system includes a stretchable substrate, a first electrical component, and a second electrical component. Both the first and second electrical components are located on the stretchable substrate. The first and second electrical components are electrically coupled to each other by an electrical connection that extends along the stretchable substrate. In some examples, the stretchable substrate is a mesh configuration and may be stretchable in one or more different directions. The first and second electrical components may both include flexible substrates or may include substrates of different flexibility, such as a rigid substrate and a flexible substrate.

In other examples, a system includes a stretchable common conductor substrate, a first electrical component that includes a first substrate, and a second electrical component that includes a second substrate. The first and second electrical components are electrically connected by an electrical connection that extends between the components and along the stretchable common conductor substrate.

In still other examples, a method comprises electrically coupling a first electrical component to a stretchable common conductor substrate and electrically coupling a second electrical component to the stretchable common conductor substrate. The method also includes electrically connecting the first electrical component and the second electrical component through an electrical connection that extends through the common conductor substrate.

BRIEF DESCRIPTION OF THE DRAWINGS

FIGS. 1A-1C is an example integration of memory cells and printed decoder units on a common connector substrate, in accordance with aspects of the invention.

DETAILED DESCRIPTION

Figure 1A:
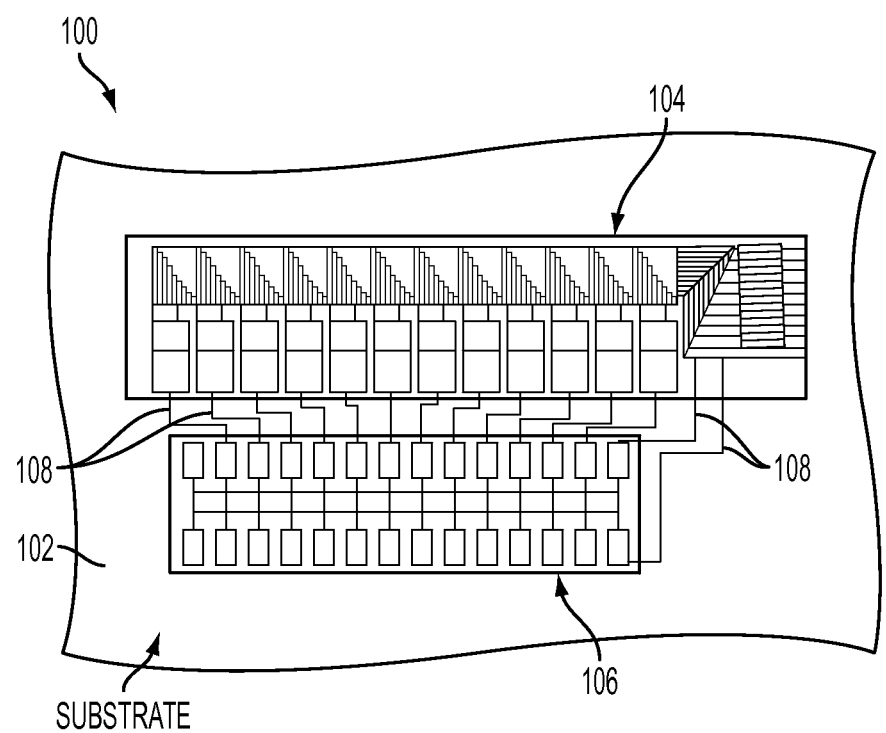

The disclosure relates to a system in which a common conductor substrate provides electrical connection(s) between two or more electrical components. The electrical components are discrete and are each fabricated on their own substrates that are distinct from the common conductor substrate that electrically connects the components together. Various types of electrical components may be electrically connected in this manner.

For example, electrical components fabricated by conventional methods, like photolithography, and printed circuits, alike can be electrically connected via electrical connections that extend along the common conductor substrate. The electrical components fabricated by conventional methods often include a rigid substrate. The rigid substrate can be bonded or otherwise secured to the common conductor substrate.

Other electrical components also can be bonded or otherwise secured to the common conductor substrate, such as printed circuits that include a flexible substrate. Printed circuits can include conductors, semiconductors, dielectrics, and other components that are directly printed on a mechanically flexible substrate. Such electrical components offer low-temperature processing of electrical components on flexible substrates, but can suffer from lower performance than electrical components fabricated from more conventional methods, such as those described above.

The common conductor substrate can be stretchable in any suitable number of directions. The stretchability of the common conductor substrate enables the integration of the conventional electrical components including a rigid substrate and the printed circuits that have a flexible substrate. Further, the common conductor substrate's stretchability provides mechanical flexibility of the integrated system to allow for reconfiguration of the individual electrical components. Still further, bonding the discrete electrical components to a common conductor substrate allows the electrical connections to occur at any position on the device, not just at the step edge between the electrical component and the common conductor substrate.

The common conductor substrate is stretchable and can be manufactured with flexible plastics, such as polyethylene naphthalate (PEN), polyethylene terephthalate (PET), polyimide, and the like. The common conductor substrate may also be a fabric or any other suitable stretchable material such as polydimethylsiloxane (PDMS). Some example common conductor substrates have a mesh configuration, although other configurations can be used.

The electrical connections between the electrical components include traces that may be conductors such as silver (Ag), copper (Cu), molybdenum chromium (MoCr), indium tin oxide (ITO), poly(3,4-ethylenedioxythiophene) poly(styrenesulfonate) (PEDOT:PSS), nano-materials (carbon nanotubes, graphene flakes), and the like. A layer of dielectric such as poly(methyl methacrylate) (PMMA), Teflon, spin-on glass, or the like, can be deposited over the conductor traces and via holes are drilled through the dielectric by laser or by solvent etching. The top conductor trace can then be printed over the dielectric to form electrical connections between the electrical components. The printing tool used to print the traces on the substrate can be a digital printer such as inkjet, aerosol jet, spray coating, and the like.

Some example systems include electrically connecting electrical components of different heights together on the common conductor substrate, regardless of the type of substrate on which the electrical component is fabricated (rigid v. flexible). Other example systems include electrically connecting electrical components having different or the same types of substrates on which they are fabricated. For example, a system may include an electrical component fabricated by conventional methods, such as a photolithography, which includes a rigid substrate, and an electrical component fabricated by direct printing, which includes a flexible substrate. The conventional electrical component and the printed circuit are both bonded to the common conductor substrate and are integrated together through an electrical connection that extends along the common conductor substrate.

Other example systems include connecting multiple discrete electrical components that are each printed on a flexible substrate. The yield of the printed circuits can be low, such as around 90%. For circuits with a complexity beyond 50 thin-film transistors (TFTs), the probability of success is lower than 1%. To compensate for this low yield, the printed circuits can be divided into sub-units and assembled on a common conductor substrate to electrically connect the electrical components with good performance together.

The common conductor substrate defines a plane along which the electrical connections between the electrical components in the system extend. All electrical connections extend along the plane defined by the common conductor substrate, which allows electrical components of different heights to be easily electrically connected along the plane without accounting for the height difference of the connected components.

As described above, the common conductor substrate can be a mesh configuration. The mesh configuration can include intersecting traces that define trace pathways. The intersecting traces can form any suitable shapes, such as squares, diamonds, circles, and triangles. In some examples, the intersections at which the traces cross each other can include a void that creates an electrical connection only when the void is filled with a conductor. Trace pathways are created by filling in consecutive voids between electrical components. In an alternative configuration, the intersections at which the traces cross each other are filled with a conductor. Various traces and trace pathways are created by removing the conductor at the intersections of the traces to create a void surrounding the trace pathway between the electrical components that need to be connected. For example, a trace pathway exists between a first and a second electrical component. The intersections of the traces along the trace pathway remain filled with a conductor. The intersections surrounding the trace pathway each have a void that was removed from the trace so that the electrical signals travel along the intended trace pathway.

Referring now to FIGS. 1A-1C, an example system 100 is shown that includes a common conductor substrate 102, a plurality of printed decoder components 104, and a plurality of memory cells 106 that were fabricated by conventional photolithography. The printed decoders 104 and the memory cells 106 are both bonded to the common conductor substrate 102. FIG. 1B shows an example component 104, having a substrate 114, mounted to the common conductor substrate 104. Further shown, is an example memory cell, having a substrate 116, mounted to the common conductor substrate 102. FIG. 1C is a top view, of FIG. 1B, showing the components 104 and 106 mounted to the common conductor substrate 102. Each of the component substrates 114 and 116 can be flexible or rigid. Electrical connections 108 extend between the printed decoders 104 and the memory cells 106 along the common conductor substrate 102 in this integrated system.

Figure 2:
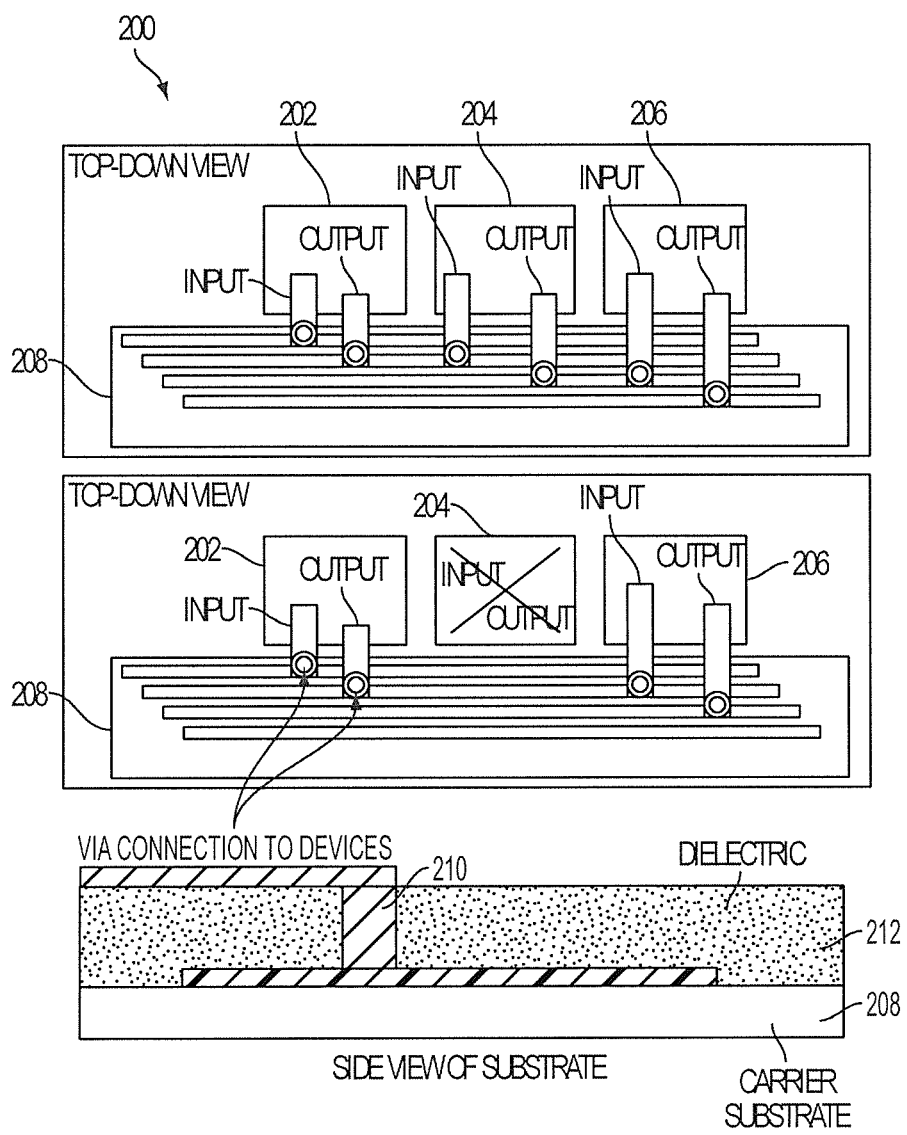
FIG. 2 is an example re-routing of a shorted shift register with three consecutive units on a common connector substrate, according to aspects of the invention.

FIG. 2 shows a side view of an example system 200 that includes three consecutive units 202, 2040, 206 of a shift register. The second unit 204 of the shift register is found to have a shorting fault. The faulty unit is re-routed on the common conductor substrate 208 and the shift register is reconfigured to avoid the faulty second unit 204. The re-routing can occur because the electrical connections of the units 202, 204, 206 of the shift register extend along the common conductor substrate 208. The units 202, 204, 206 are discrete from one another and can be re-routed without regard for the faulty units. Each unit of the shift register is bonded to the common conductor substrate 208 through a via 210 that is drilled or etched through a dielectric layer 212, in this example.

Figure 3:
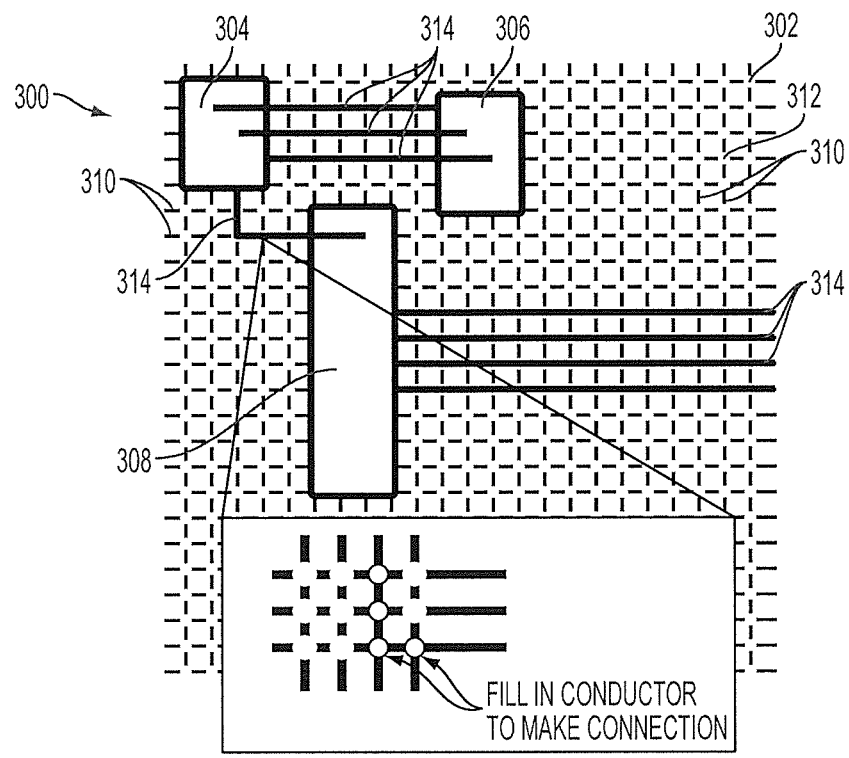
FIG. 3 shows a routing example of a system having a mesh common connector substrate and three electrical components that can be electrically connected by creating a conductor in the space along the traces between the electrical components, in accordance with aspects of the invention.

FIG. 3 shows a system 300 having a common conductor substrate 302 with a mesh configuration and three electrical components 304, 306, 308. The mesh configuration includes multiple intersecting traces 310. A void 312 is defined by an intersection of each trace that prevents electrical signals from passing through the intersection. The void 312 can be filled with a conductor material that permits the electrical signal to pass. Trace pathways 314 are shown between the electrical components 304, 306, 308 and extending away from the electrical components 304, 306, 308. The intersections along the trace pathways 314 have been filled by conductor material.

Figure 4:
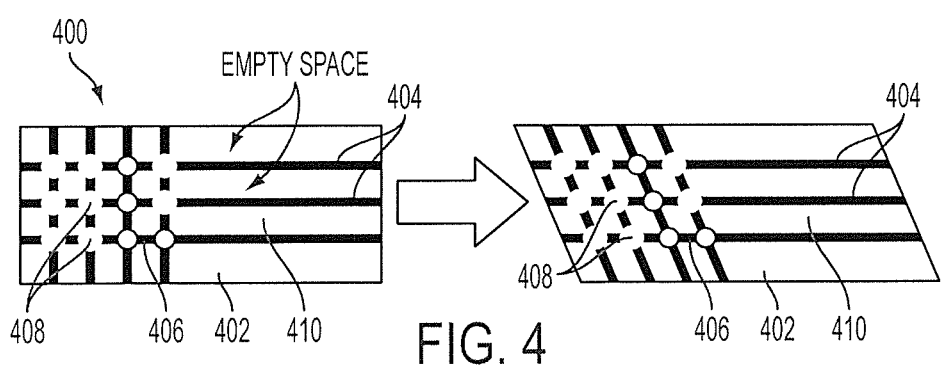
FIG. 4 shows another example of a system having a mesh common connector substrate in which empty space between traces that can be removed to provide electrical connections, according to aspects of the invention.

FIG. 4 shows an alternative to the embodiment shown in FIG. 3. The system 400 shown in FIG. 4 includes a portion of a common conductor substrate 402 with a mesh configuration having multiple intersecting traces 404 of solid conductor material. A trace pathway 406 is defined by creating voids 408 at the intersections surrounding the desired trace pathway 406 to prevent electrical signals from traveling along a trace other than the desired trace pathway 406. In this example, the empty space 410 between the traces permits the common conductor substrate 402 to stretch in various directions. In some examples, the common conductor substrate can stretch in three-dimensions.

The systems described herein can be created by the following methods. A first electrical component is electrically coupled to a stretchable common conductor substrate. A second electrical component is electrically coupled to the same stretchable common conductor substrate. The first electrical component and the second electrical component are electrically connected to each other through an electrical connection that extends through the common conductor substrate. The first and the second electrical components include any suitable combination of electrical components fabricated by conventional methods, such as photolithography, and/or fabricated by direct printing methods.

It will be appreciated that variations of the above-disclosed connector substrate and methods and other features and functions, or alternatives thereof, may be desirably combined into many other different systems, methods, or applications. Also various presently unforeseen or unanticipated alternatives, modifications, variations, or improvements therein may be subsequently made by those skilled in the art which also are intended to be encompassed by the following claims.

The invention claimed is:

1. A system, comprising:
    a mechanically flexible, common conductor substrate;
    a plurality of first electrical traces disposed on the common conductor substrate;
    a mechanically flexible layer of dielectric material disposed on the plurality of first electrical traces and the common conductor substrate:
    a first electrical component disposed on the dielectric material;
    a second electrical component disposed on the dielectric material; and
    a plurality of second traces extending from the first and second electrical components along a surface of the dielectric material;
    wherein the first electrical component and the second electrical component are electrically connected together by respective second traces, the respective second traces electrically connected to a common one of the first electrical traces through one or more vias that extend transversely through the dielectric layer.

2. The system of claim 1, wherein the common conductor substrate is stretchable.

3. The system of claim 1, wherein the common conductor substrate includes a fabric.

4. The system of claim 1, wherein the common conductor substrate includes plastic.

5. The system of claim 1, wherein the first electrical component and the second electrical component are each printed circuits and each include flexible substrates.

6. The system of claim 1, wherein the first electrical component includes a rigid substrate and the second electrical component includes a flexible substrate.

7. The system of claim 1, wherein the common conductor substrate defines a plane and wherein the first and second electrical traces and the dielectric layer are located on the plane.

\* \* \* \* \*